(12) United States Patent
Ehara et al.

(10) Patent No.: US 6,377,140 B1
(45) Date of Patent: Apr. 23, 2002

(54) SAW RESONATOR FILTER WITH BRIDGED-T CONFIGURATION

(75) Inventors: Hisanori Ehara; Hajime Shimamura; Yoshiaki Fujita; Tomokazu Komazaki, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/526,490

(22) Filed: Mar. 15, 2000

(30) Foreign Application Priority Data

Jul. 9, 1999 (JP) .......................................... 11-195928

(51) Int. Cl.[7] .................................................. H03H 9/64
(52) U.S. Cl. ...................... 333/193; 333/194; 310/313 R
(58) Field of Search ................................ 333/187, 189, 333/190, 193, 194; 310/313 R

(56) References Cited

U.S. PATENT DOCUMENTS

| 5,559,481 A | | 9/1996 | Satoh et al. | |
|---|---|---|---|---|
| 5,631,612 A | | 5/1997 | Satoh et al. | |
| 5,729,186 A | * | 3/1998 | Seki et al. | 333/194 |
| 5,847,626 A | * | 12/1998 | Taguchi et al. | 333/193 |
| 5,874,866 A | * | 2/1999 | Satoh et al. | 331/107 A |
| 5,939,957 A | * | 8/1999 | Iwata | 333/189 |
| 5,952,899 A | * | 9/1999 | Kadota et al. | 333/193 |
| 6,204,737 B1 | * | 3/2001 | Ella | 333/187 |

FOREIGN PATENT DOCUMENTS

JP 5-167388 7/1993

OTHER PUBLICATIONS

H. Shimamura et al., "A Consideration of the Lumped Constant Elements of SAW Filter using Resonators", p. 313 (1996).

* cited by examiner

*Primary Examiner*—Robert Pascal
*Assistant Examiner*—Dean Takaoka
(74) *Attorney, Agent, or Firm*—Venable; Robert J. Frank; Michael A. Sartori

(57) ABSTRACT

A surface-acoustic-wave filter has a pair of series-arm surface-acoustic-wave resonators and a shunt-arm surface-acoustic-wave resonator coupled in a T configuration. An additional bridging surface-acoustic-wave resonator is coupled between the input and output terminals, in parallel with the series arm. The bridging surface-acoustic-wave resonator provides enhanced attenuation of spurious signals at multiples of the passband frequency.

16 Claims, 4 Drawing Sheets

SAW RESONATOR FILTER WITH BRIDGED-T CONFIGURATION

BACKGROUND OF THE INVENTION

The present invention relates to a surface-acoustic-wave filter of the resonator type, useful as a radio-frequency filter in a portable communication device.

Compact, lightweight portable telephone sets and other portable communication equipment have been undergoing intensive development in recent years. Small, lightweight, high-performance components are required.

Surface-acoustic-wave (SAW) filters are small and lightweight, require no adjustment, and can be manufactured in large quantities by the same photolithographic technology that is used to manufacture semiconductor devices. Moreover, the amplitude characteristics and phase characteristics of a SAW filter can be controlled independently. SAW filters are finding increasing use as picture-signal intermediate-frequency (PIF) filters, vestigial sideband (VSB) filters, and other types of communication filters, and as filters for digital signal processing.

SAW filters are also used in the radio-frequency (RF) sections of portable telephone sets, where they have played a significant role in the achievement of improved performance and small size. The type of SAW filter that has been mainly used is a ladder filter employing SAW resonators. In addition to small size, this type of filter offers the advantages of narrow bandwidth, low insertion loss in the passband, and high attenuation in the adjacent stopbands, and it does not require a matching circuit.

FIG. 1 shows a conventional ladder filter of the SAW resonator type, having two series-arm SAW resonators 11, 12, and one shunt-arm or parallel-arm SAW resonator 13. The series-arm SAW resonators 11, 12, referred to below as SR1 and SR2, are coupled in series between an input terminal 14 and an output terminal 15. The input terminal 14 is paired with a ground or earth (E) terminal 16 to form the input port of the filter. The output terminal 15 is paired with another ground terminal 17 to form the output port. The shunt-arm SAW resonator 13, referred to below as PR1, is coupled on one side to both ground terminals 16, 17, and on the other side to a node located between the two series-arm SAW resonators SR1 and SR2.

Each SAW resonator SR1, SR2, PR1 comprises an interdigital transducer (IDT, not visible) flanked by a pair of grating reflectors (not visible). FIG. 2 shows an equivalent circuit of one half of the SAW filter in FIG. 1, representing each SAW resonator as a capacitance $C_0$, equivalent to the capacitance of the IDT, paralleled by an inductance L in series with a capacitance C. This is also the equivalent circuit configuration that is used to represent a crystal resonator. A resonator that can be represented in this way has a reactance characteristic with both a resonance frequency and an antiresonance frequency. A bandpass filter can be created by a ladder configuration of such resonators, in the same way that an inductor-capacitor (LC) bandpass filter is configured, by making the antiresonance frequency of the shunt-arm resonator PRE11 substantially equal to the resonance frequency of the series-arm resonator SRE10. SRE10 represents SR1 in FIG. 1, while PRE11 represents half of PR1 in FIG. 1.

The configuration in FIG. 1 is known as a T-type filter configuration. A T-type filter has relatively small attenuation, but the attenuation can be increased by adding more SAW resonator stages.

Portable telephone systems and other mobile communication systems are becoming increasingly diversified. Increasing numbers of channels, diminishing gaps between transmitting and receiving frequency bands, and widening passbands are the order of the day. Because of the advantage of their small size, SAW filters that can meet the necessary requirements are highly desirable, but a SAW filter of the conventional ladder type can satisfy only a limited range of requirements.

For example, portable telephones in a widely promoted code division multiple access (CDMA) system transmit in one band (824 to 849 megahertz or MHz) and receive in another band (869 to 894 MHz). The RF filters of these portable telephone sets must meet insertion-loss and attenuation requirements in these bands, and must also meet requirements for attenuation of spurious signals at two and three times the center frequency ($2f_c$ and $3f_c$) of these bands. SAW filters of the conventional ladder type cannot meet these spurious-signal attenuation requirements.

A conventional solution to this problem is to provide a separate lumped-constant filter or a quarter-wave ($\lambda/4$) stripline inside the RF package to reject the spurious signal components, but it would obviously be preferable to have the spurious components eliminated by the SAW filter itself.

SUMMARY OF THE INVENTION

It is accordingly an object of the present invention to provide a SAW filter that meets requirements for spurious-signal attenuation at multiples of the center frequency.

The invented SAW filter has a T-type configuration with a series arm, a shunt arm, an input terminal, an output terminal, and a ground terminal. The series arm has a first SAW resonator and a second SAW resonator coupled in series between the input terminal and the output terminal. The shunt arm has a third SAW resonator coupled between the ground terminal and a node located between the first and second SAW resonators on the series arm. The SAW filter also has a fourth SAW resonator coupled between the input terminal and the output terminal, in parallel with the series arm.

The fourth SAW resonator adds another pole to the attenuation characteristic of the SAW filter. This pole can be placed to provide additional attenuation at frequencies substantially equal to, or greater than, twice the center frequency of the passband of the SAW filter.

DETAILED DESCRIPTION OF THE INVENTION

Figure 1:
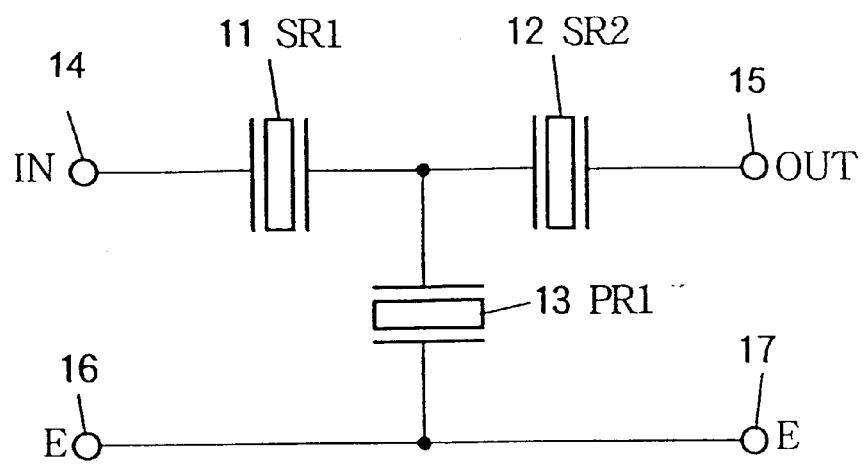
FIG. 1 is a circuit diagram of a SAW resonator filter of the conventional ladder type.
Figure 2:
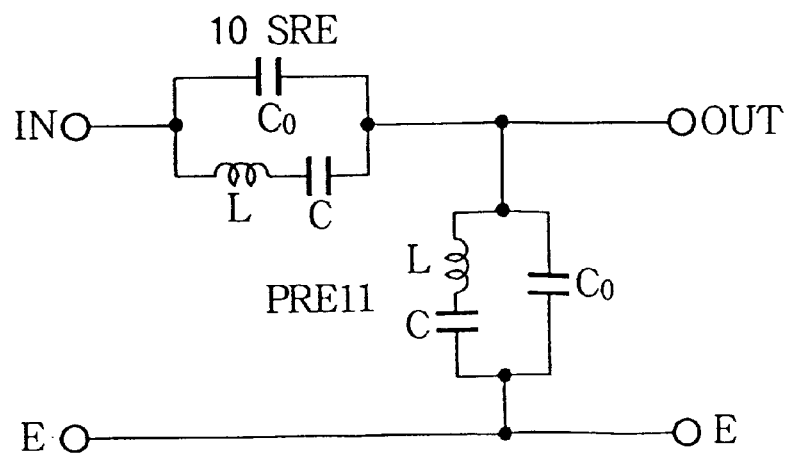
FIG. 2 is an equivalent circuit diagram of one half of the filter in FIG. 1.

Embodiments of the invention will be described with reference to the attached drawings, in which like parts are indicated by like reference characters.

Figure 3:
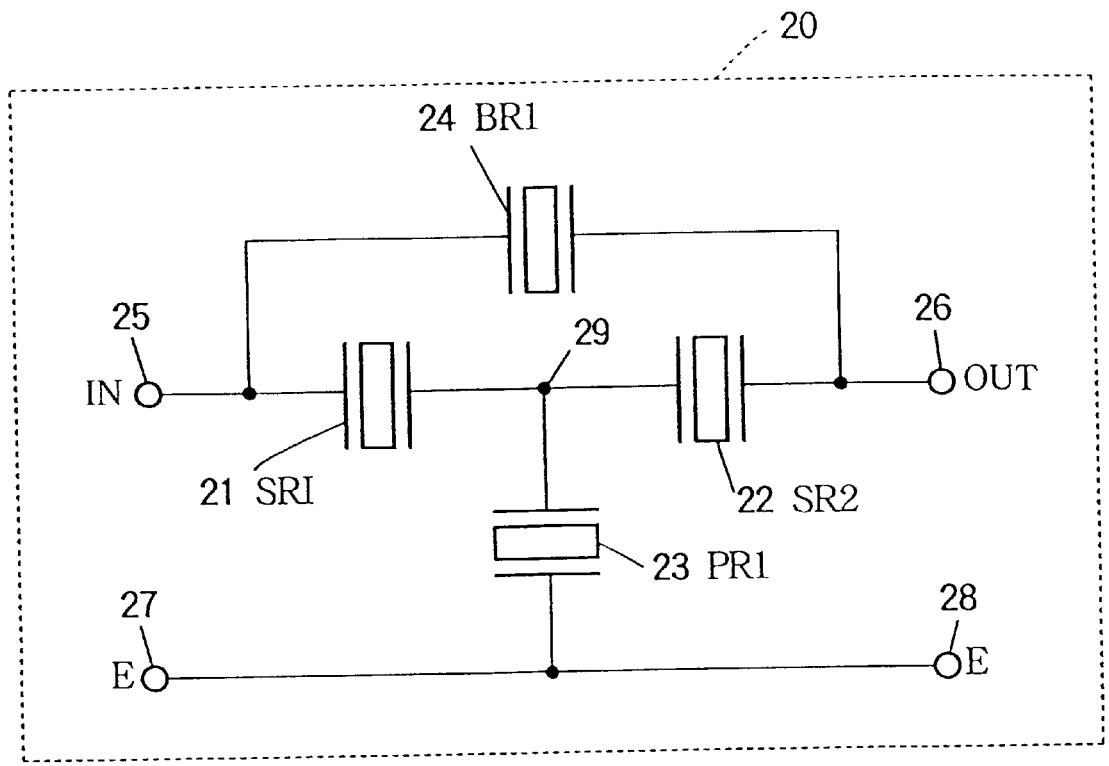
FIG. 3 is a circuit diagram of a SAW resonator filter illustrating a first embodiment of the invention.

Referring to FIG. 3, the first embodiment is a SAW resonator filter suitable for use in a CDMA portable telephone set. The filter 20 has a bridged T configuration, comprising series-arm SAW resonators SR1 21 and SR2 22, a shunt-arm SAW resonator PR1 23, and a bridging SAW resonator BR1 24. The series-arm SAW resonators SR1, SR2 are coupled in series between an input terminal 25 and an output terminal 26. The bridging SAW resonator BR1 is also coupled between the input terminal 25 and output terminal 26, in parallel with the two series-arm SAW resonators SR1, SR2. The shunt-arm SAW resonator PR1 is coupled on one side to a pair of ground terminals 27, 28, and on the other side to a node 29 on the series arm between the two series-arm SAW resonators SR1, SR2. All four SAW resonators SR1, SR2, PR1, BR1 are formed on a single piezoelectric substrate or chip. The circuit configuration of this bridged-T filter 20 is that of a conventional T-type filter with a novel bridging SAW resonator BR1.

For use in a CDMA portable telephone, the aperture, number of IDT electrode fingers, and resonance frequency of the bridging SAW resonator BR1 are selected so as to provide a certain attenuation at frequencies equal to two and three times the center frequency ($f_c$) of the passband of the filter 20, without affecting operation in the transmitting band (824–849 MHz) or receiving band (869–894 MHz). The other SAW resonators SR1, SR2, PR1 can be designed by the same techniques as used to design a ladder filter of the conventional T type.

Figure 4:
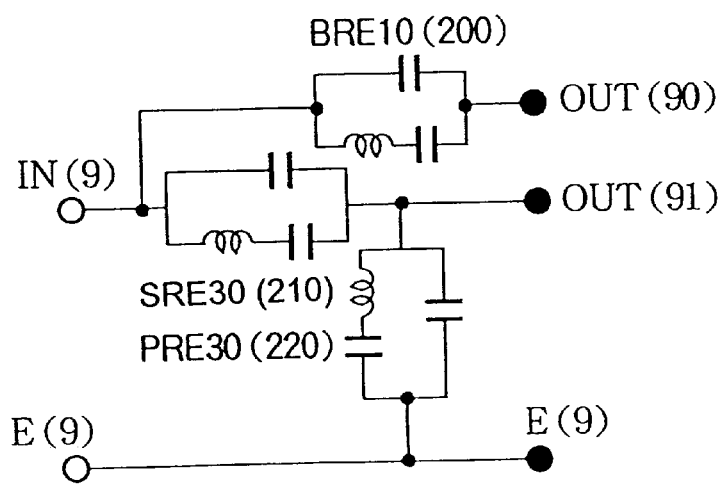
FIG. 4 is an equivalent circuit diagram of one half of the filter in FIG. 4.

FIG. 4 is an equivalent lumped-constant circuit diagram corresponding to one half-section of the filter 20 in FIG. 3. BRE10(200) corresponds to half of the bridging SAW resonator BR1 in FIG. 3. SRE30(210) corresponds to SAW resonator SR1 in FIG. 3. PRE30(220) corresponds to half of SAW resonator PR1 in FIG. 3. The black dots OUT(90), OUT(91), E(9) represent the output terminals of this half-section.

The characteristics of this equivalent circuit can be calculated from Zshort, which is the impedance when OUT (90), OUT(91), and E(9) are mutually interconnected, and Zopen, when is the impedance when OUT(90), OUT(91), and E(9) are left open. The following relationships hold:

$$1/Zshort = 1/Zbre10 + 1/Zsre30$$

$$Zopen = Zsre30 + Zpre30$$

where $$Zbre10 = (1+S^2 L_{200} C_{200})/(S(C_{200}+C_{201})+S^3 L_{200} C_{200} C_{201})$$

$$Zsre30 = (1+S^2 L_{210} C_{210})/(S(C_{210}+C_{211})+S^3 L_{210} C_{210} C_{211})$$

$$Zpre30 = (1+S^2 L_{220} C_{220})/(S(C_{220}+C_{221})+S^3 L_{220} C_{220} C_{221})$$

In these equations, S is the angular frequency of the input signal multiplied by the square root of minus one; $L_{200}$, $C_{200}$, and $C_{201}$ represent the inductance and capacitance values of the lumped inductor and capacitors in BRE10 (200); $L_{210}$, $C_{210}$, and $C_{211}$, represent the inductance and capacitance values of the lumped inductor and capacitors in SRE30(210); and $L_{220}$, $C_{220}$, and $C_{221}$ represent the inductance and capacitance values of the lumped inductor and capacitors in PRE30(220).

The four SAW resonators BR1, SR1, SR2, PR1 in the first embodiment have the parameters shown in micrometers ($\mu$m), nanohenries (nH), and picofarads (pF) in Table 1. For example, the IDT in SAW resonator BR1 has twenty-two electrode fingers that mesh over a length or aperture of twenty-two micrometers (22 $\mu$m) and produce a pole of attenuation at a frequency of 1603 MHz, being equivalent to a 761.2-nH inductance coupled in series with a 0.0138-pF capacitance, paralleled by a 0.2-pF capacitance.

TABLE 1

| Resonator | BR1 | SR1 | SR2 | PR1 |
|---|---|---|---|---|
| Aperture ($\mu$m):fingers | 22:22 | 100:100 | 100:100 | 100:100 |
| Pole frequency (MHz) | 1603 | 918.1 | 918.1 | 853.1 |
| Equivalent $L_1$ (nH) | 761.2 | 182 | 182 | 113 |
| Equivalent $C_1$ (pF) | 0.0138 | 0.176 | 0.176 | 0.308 |
| Equivalent $C_0$ (pF) | 0.2 | 2.67 | 2.67 | 3.90 |

These parameters are substituted into the equations given above as follows.

$$L_{200}=380.6\ (nH),\ C_{200}=0.0276\ (pF),\ C_{201}=0.4\ (pF)$$

$$L_{210}=182.0\ (nH),\ C_{210}=0.176\ (pF),\ C_{211}=2.67\ (pF)$$

$$L_{220}=226.0\ (nH),\ C_{220}=0.154\ (pF),\ C_{221}=1.95\ (pF)$$

The attenuation characteristic ATT($\omega$) of the filter 20 can be calculated from Zshort and Zopen by use of the following equation. The variable $\omega$ represents the angular frequency of the input signal, and ABS indicates absolute value.

$$ATT(\omega)=20Log(ABS((Zopen+Zshort)/(Zopen-Zshort)))$$

This equation indicates poles of infinite attenuation under any of the following conditions.

$$Zopen=Zshort$$

$$Zopen=\infty$$

$$Zshort=\infty$$

For the filter 20 in FIG. 3, the above set of conditions is equivalent to the following set of conditions:

$$Zopen=Zshort$$

$$Zbre10=\infty$$

$$Zsre30=\infty$$

$$Zpre30=\infty$$

For the conventional T-type filter in FIG. 1, poles of attenuation are obtained only under the following conditions:

$$Zopen=Zshort$$

$$Zsre30=\infty$$

$$Zpre30=\infty$$

Adding the bridging SAW resonator 24 to the filter 20 in FIG. 3 thus adds another pole of attenuation. Conversely, the conventional T-type filter in FIG. 1 is obtainable from the filter 20 in FIG. 3 by the following settings, which remove a pole of attenuation.

$$L_{200}=\infty\ (nH)$$

$$C_{200}=0.0\ (pF)$$

$$C_{201}=0.0\ (pF)$$

Figure 5:
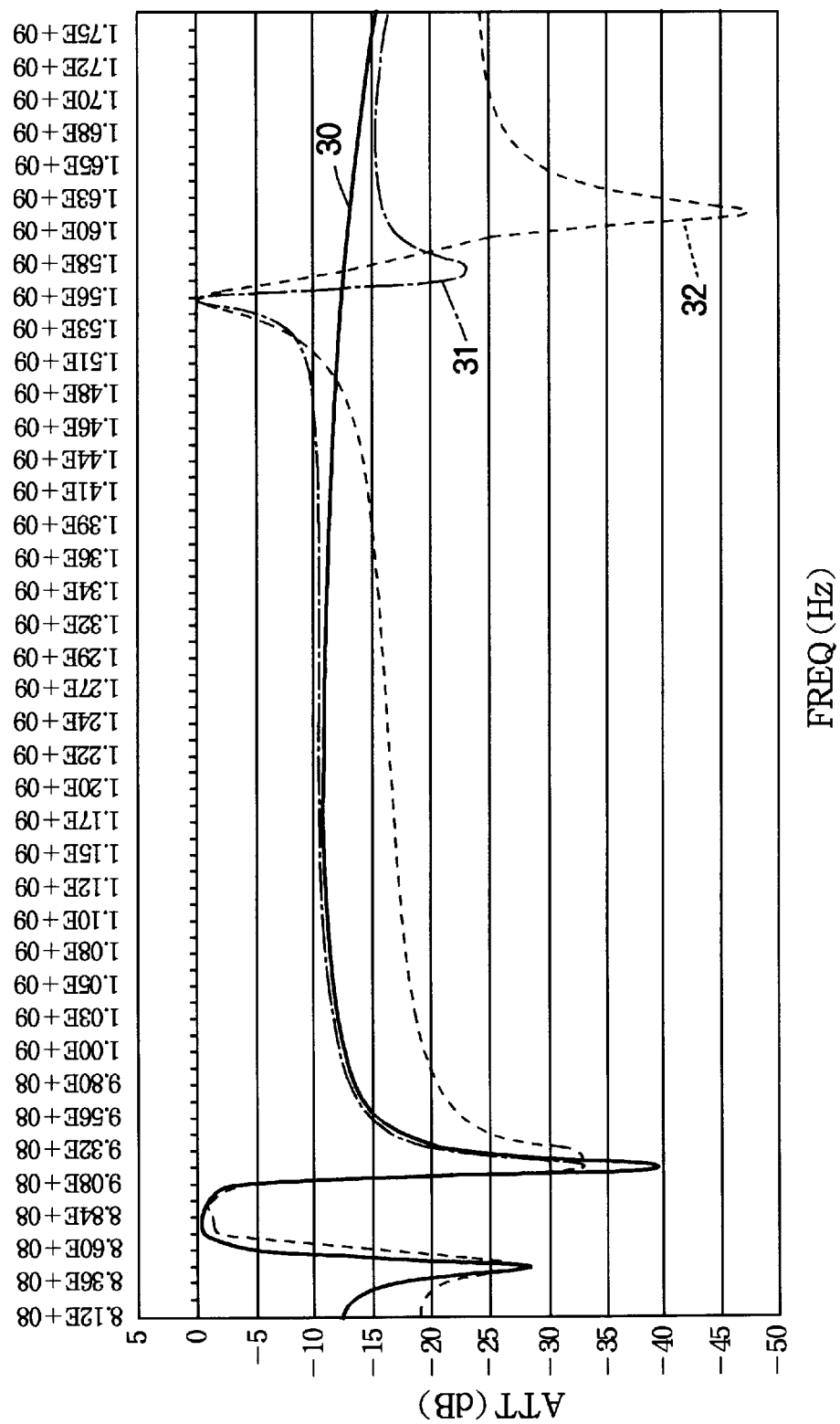
FIG. 5 is a graph of attenuation characteristics of a conventional SAW resonator filter and filters embodying the invention.

The performance of the conventional T-type SAW filter and the invented SAW filter 20 was simulated by lumped-constant equivalent circuits, using the parameters given in Table 1 for both filters, with BR1 omitted from the conventional filter. The results shown in FIG. 5 were obtained. Input frequency is indicated in hertz on the horizontal axis, using exponential notation (8.12E+08 indicates $8.12 \times 10^8$ Hz, or 812 MHz). Attenuation is indicated in decibels (dB) on the vertical axis. The solid line 30 is the attenuation characteristic of the conventional T-type filter in FIG. 1. The dash-dot line 31 is the attenuation characteristic of the filter 20 in the first embodiment.

A comparison of these characteristics shows that both filters have poles of attenuation surrounding the CDMA receiving band (at 850 MHz and 920 MHz), but the filter 20 in the first embodiment has an additional pole at a frequency (1580 MHz) a little below the $2f_c$ spurious frequency. This pole provides additional attenuation in the $2f_c$ and $3f_c$ spurious bands, so that the attenuation requirements at these spurious frequencies can be met without the use of an additional filter.

Thus whereas with the conventional SAW filter, an additional lumped-constant filter or $\lambda/4$ stripline was necessary in the RF package, the first embodiment provides an equivalent capability on the SAW filter chip itself, enabling the dimensions of the RF package to be reduced.

Figure 6:
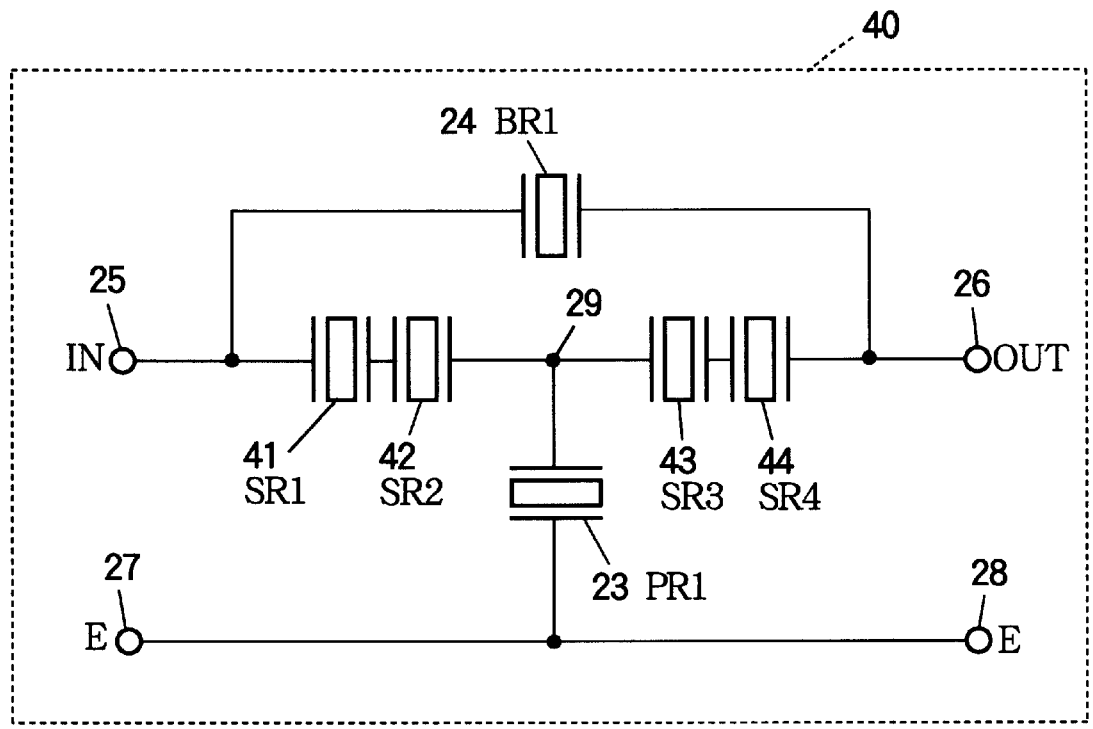
FIG. 6 is a circuit diagram of a SAW resonator filter illustrating a second embodiment of the invention.

Referring to FIG. 6, the second embodiment is a filter 40 having four series-arm SAW resonators SR1 41, SR2 42, SR3 43, and SR4 44. The shunt-arm SAW resonator PR1 23, bridging SAW resonator BR1 24, input and output terminals 25, 26, and ground terminals 27, 28 are as described in the first embodiment. The shunt-arm SAW resonator PR1 is coupled to a node 29 between series-arm SAW resonators SR2 and SR3. The bridging SAW resonator BR1 is coupled to the input and output terminals 25, 26, in parallel with the series arm.

The SAW resonators in the second embodiment have the parameters listed in Table 2, Ap meaning aperture.

TABLE 2

| Resonator | BR1 | SR1 | SR2 | SR3 | SR4 | PR1 |
| --- | --- | --- | --- | --- | --- | --- |
| Ap:fingers | 22:22 | 100:100 | 100:100 | 100:100 | 100:100 | 100:100 |
| Pole (MHz) | 1603 | 918.1 | 928 | 918.1 | 928 | 858 |
| Eq. $L_1$ (nH) | 761.2 | 182 | 180.0 | 182 | 180 | 112.4 |
| Eq. $C_1$ (pF) | 0.0138 | 0.176 | 0.174 | 0.176 | 0.174 | 0.308 |
| Eq. $C_0$ (pF) | 0.02 | 2.67 | 2.64 | 2.67 | 2.64 | 3.88 |

The attenuation characteristic of the second embodiment was simulated on the basis of lumped constants with the values indicated in Table 2. The result is indicated by the dotted line 32 in FIG. 5. As in the first embodiment, poles of attenuation are present on both sides of the CDMA receiving band (at 850 MHz and 920 MHz), and a little below the $2f_c$ spurious frequency (at 1600 MHz). Attenuation in the $2f_c$ and $3f_c$ spurious bands is much higher than in the first embodiment, however. The second embodiment provides excellent rejection of spurious signals without the use of additional components in the RF package.

Figure 7:
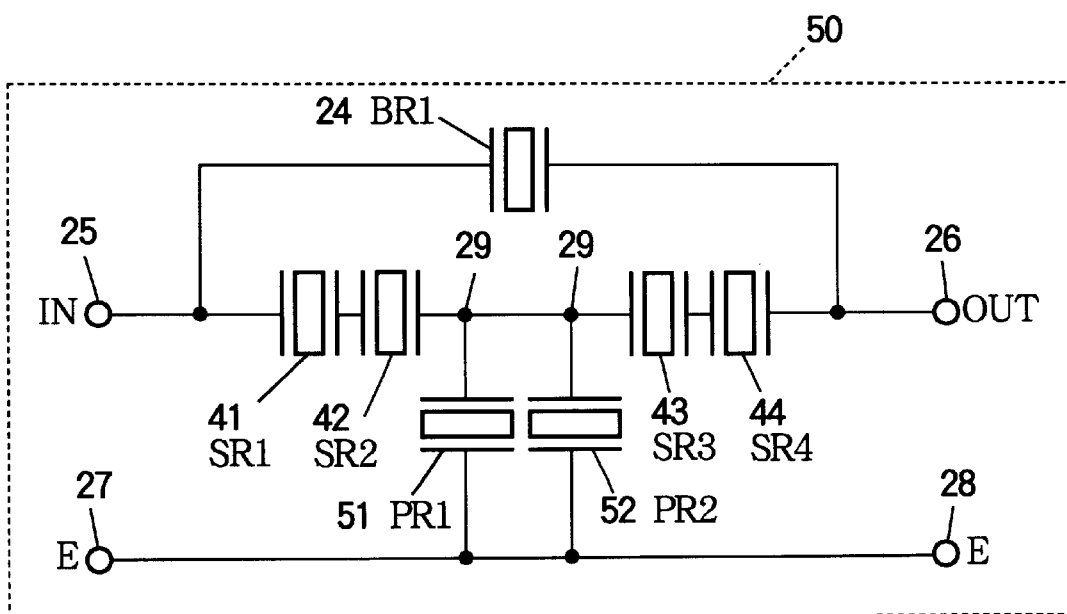
FIG. 7 is a circuit diagram of a SAW resonator filter illustrating a third embodiment of the invention.

Referring to FIG. 7, the third embodiment is a filter 50 that adds a second shunt-arm SAW resonator PR2 52 to the configuration of the second embodiment. The second shunt-arm SAW resonator PR2 is coupled in parallel with the first shunt-arm SAW resonator PR1 to the node 29 between series-arm SAW resonators SR2 and SR3, and to the ground terminals 27, 28. Spurious-signal attenuation effects similar to those in the second embodiment are obtained.

When used as RF filters in CDMA communication devices such as portable telephones, the embodiments above enable $2f_c$ and $3f_c$ spurious-band attenuation requirements to be met without the use of additional components that would increase the size of the RF package. The second and third embodiments enable very favorable spurious-signal rejection performance to be achieved in a small RF package.

The invention is not limited to the specific ladder filter configurations illustrated by the above embodiments, but can be practiced in any filter configuration having a series arm and a shunt arm coupled in a T configuration, by inserting an additional SAW resonator between the input and output terminals, in parallel with the series arm.

No restrictions are placed on the chip or package materials, or on the shapes of the interconnection patterns, ground patterns and so on in the package.

Applications of the invention are not limited to CDMA communication equipment.

Those skilled in the art will recognize that further variations are possible within the scope claimed below.

What is claimed is:

1. A surface-acoustic-wave filter having a T-type configuration with a series arm, a shunt arm, an input terminal, an output terminal, and a ground terminal, the series arm having a node, a first surface-acoustic-wave resonator coupled between said node and the input terminal, and a second surface-acoustic-wave resonator coupled between said node and the output terminal, the shunt arm having a third surface-acoustic-wave resonator coupled between said node and the ground terminal, the third surface-acoustic-wave resonator having an antiresonance frequency, the first surface-acoustic-wave resonator having a resonance frequency substantially equal to said antiresonance frequency, the surface-acoustic-wave filter also comprising:

a fourth surface-acoustic-wave resonator coupled between the input terminal and the output terminal, in parallel with the series arm.

2. The surface-acoustic-wave filter of claim 1, wherein the series arm has a fifth surface-acoustic-wave resonator coupled in series with the first surface-acoustic-wave resonator between the input terminal and said node.

3. The surface-acoustic-wave filter of claim 1, wherein the series arm has a fifth surface-acoustic-wave resonator coupled in series with the second surface-acoustic-wave resonator between said node and the output terminal.

4. The surface-acoustic-wave filter of claim 1, wherein the series arm has a fifth surface-acoustic-wave resonator coupled in series with the first surface-acoustic-wave resonator between the input terminal and said node, and a sixth surface-acoustic-wave resonator coupled in series with the second surface-acoustic-wave resonator between said node and the output terminal.

5. The surface-acoustic-wave filter of claim 1, wherein the shunt arm has a fifth surface-acoustic-wave resonator coupled in parallel with the third surface-acoustic-wave resonator between said node and the ground terminal.

6. The surface-acoustic-wave filter of claim 1, wherein current flows undivided between the input terminal and the output terminal through the fourth surface-acoustic-wave resonator.

7. The surface-acoustic-wave filter of claim 1, wherein the fourth surface-acoustic-wave filter attenuates at least one multiple of a center frequency of the surface-acoustic-wave filter.

8. A surface-acoustic-wave filter comprising:

an input terminal;

an output terminal;

a ground terminal;

first and second surface-acoustic-wave resonators coupled as series-arm resonators between the input terminal and the output terminal, the first surface-acoustic-wave resonator having a resonance frequency;

a third surface-acoustic-wave resonator coupled as a shunt-arm resonator between the first surface-acousticwave resonator and the ground terminal, the third surface-acoustic-wave resonator having an antiresonance frequency substantially equal to the resonance frequency of the first surface-acoustic-wave resonator; and a fourth surface-acoustic-wave resonator coupled between the input terminal and the output terminal in parallel with the first and second surface-acoustic-wave resonators.

9. The surface-acoustic-wave filter of claim 8, wherein the third surface-acoustic-wave resonator is connected to the second surface-acoustic-wave resonator.

10. The surface-acoustic-wave filter of claim 8, further comprising:

a node disposed between the first surface-acoustic-wave resonator and the second surface-acoustic-wave resonator; and a fifth surface-acoustic-wave resonator coupled in series with the first surface-acoustic-wave resonator between the input terminal and said node.

11. The surface-acoustic-wave filter of claim 8, further comprising:

a node disposed between the first surface-acoustic-wave resonator and the second surface-acoustic-wave resonator; and a fifth surface-acoustic-wave resonator coupled in series with the second surface-acoustic-wave resonator between said node and the output terminal.

12. The surface-acoustic-wave filter of claim 8, further comprising:

a node disposed between the first surface-acoustic-wave resonator and the second surface-acoustic-wave resonator;

a fifth surface-acoustic-wave resonator coupled in series with the first surface-acoustic-wave resonator between the input terminal and said node; and a sixth surface-acoustic-wave resonator coupled in series with the second surface-acoustic-wave resonator between said node and the output terminal.

13. The surface-acoustic-wave filter of claim 9, further comprising:

a node disposed between the first surface-acoustic-wave resonator and the second surface-acoustic-wave resonator; and a fifth surface-acoustic-wave resonator coupled in parallel with the third surface-acoustic-wave resonator between said node and the ground terminal.

14. The surface-acoustic-wave filter of claim 9, further comprising:

a node disposed between the first surface-acoustic-wave resonator and the second surface-acoustic-wave resonator, wherein the third surface-acoustic-wave resonator is coupled between said node and the ground terminal.

15. The surface-acoustic-wave filter of claim 9, wherein current flows undivided between the input terminal and the output terminal through the fourth surface-acoustic-wave resonator.

16. The surface-acoustic-wave filter of claim 9, wherein the fourth surface-acoustic-wave filter attenuates at least one multiple of a center frequency of the surface-acoustic-wave filter.

* * * * *